United States Patent
Hu et al.

(10) Patent No.: US 8,097,879 B2
(45) Date of Patent: Jan. 17, 2012

(54) LIGHT EMITTING DIODE AND METHOD FOR MANUFACTURING THE SAME

(75) Inventors: Qiu-Hong Hu, Göteborg (SE); Magnus Willander, Linköping (SE); Victor Kouzmine, Göteborg (SE)

(73) Assignee: Eco Spark AB, Enskede (SE)

(*) Notice: Subject to any disclaimer, the term of this patent is extended or adjusted under 35 U.S.C. 154(b) by 0 days.

(21) Appl. No.: 12/085,390

(22) PCT Filed: Nov. 23, 2006

(86) PCT No.: PCT/EP2006/011238
§ 371 (c)(1),
(2), (4) Date: Sep. 4, 2009

(87) PCT Pub. No.: WO2007/059961
PCT Pub. Date: May 31, 2007

(65) Prior Publication Data
US 2010/0025673 A1    Feb. 4, 2010

(30) Foreign Application Priority Data
Nov. 25, 2005  (EP) .................... 05111332

(51) Int. Cl.
*H01L 33/00* (2010.01)
*H01L 21/20* (2006.01)
(52) U.S. Cl. .............. 257/43; 257/79; 257/E33.019; 257/E21.09; 438/46; 438/104
(58) Field of Classification Search .......... 257/43, 257/79, E33.019, E21.09; 438/46, 34, 104
See application file for complete search history.

(56) References Cited

U.S. PATENT DOCUMENTS
2005/0194598 A1  9/2005  Kim et al.
2005/0224790 A1  10/2005  Jin et al.
2005/0227391 A1  10/2005  Jin et al.

FOREIGN PATENT DOCUMENTS
WO  WO 02/080280  10/2002
WO  WO 2004/032193  4/2004
WO  WO 2004/042830  5/2004

OTHER PUBLICATIONS
R. Könenkamp et al., "Vertical nanowire light-emitting diode" Applied Physics Letters, vol. 85, No. 24 p. 6004-6006, Dec. 13, 2004.

*Primary Examiner* — Victor A Mandala
*Assistant Examiner* — Whitney T Moore
(74) *Attorney, Agent, or Firm* — Harness, Dickey & Pierce, P.L.C.

(57) ABSTRACT

The present invention relates to a light emitting diode (100, 109), comprising at least one p-doped structure, a plurality of n-doped zinc-oxide (ZnO) nanowires (104) arranged on the at least one p-doped structure, thereby forming a plurality of p-n junctions (107a, 107b), an insulating structure (105) arranged among the plurality of ZnO-nanowires (104), to electrically separate the plurality of p-n junctions (107a, 107b), and a transparent conductive layer (106), arranged on the at least one insulating structure (105) and in electrical contact with the plurality of ZnO-nanowires (104), to enable application of a voltage over the plurality of p-n junctions (107a, 107b), thereby enabling emission of light. An advantage with the above light emitting diode (100, 109) is its improved broadband spectral distribution. Furthermore, as ZnO-nanowires (104) are used, it is possible to achieve a high brightness.

25 Claims, 3 Drawing Sheets

US 8,097,879 B2

LIGHT EMITTING DIODE AND METHOD FOR MANUFACTURING THE SAME

TECHNICAL FIELD

The present invention relates to a light emitting diode. The present invention also relates to a method for manufacturing such a light emitting diode.

TECHNICAL BACKGROUND

Recently, much progress has been made in increasing the brightness of light-emitting diodes (LEDs). As a result, LEDs have become sufficiently bright and inexpensive to serve as light sources in for example general lighting applications.

Commercial high brightness LED-technologies employs so-called thin-film technologies for constructing semiconductors. The materials used for producing high brightness LEDs are selected from the alloys of group III and group V elements in the periodic table. The most widely used semiconductor is Gallium Nitride (GaN) that has a direct band-gap of 3.26 eV.

However, due to disadvantages associated with thin-film technologies, present semiconductor technology seeks to utilize the advantages of nanowires in the areas of LEDs and laser diodes (LDs), where the nanowires are used as active components. This is due to arising advantages in performance that is possible in nanostructures, such as light extraction at low defect concentration. The diameter and length of nanowires, depending on the growth conditions, can vary from a few nanometers to a few micrometers.

US 2005/0194598 discloses a light emitting diode having a nanowire structure. The LED employs GaN nanowires in which a n-type GaN nanowire, an InGaN quantum well and a p-type GaN nanowire are subsequently formed in a longitudinal direction by inserting the InGaN quantum well into a p-n junction interface of the p-n junction GaN nanowire. A plurality of such GaN nanowires are arranged in an array. FIG. 1 illustrates the electroluminescence (EL) spectrum of the LED when a direct current of 20 to 100 mA is applied thereto. As can be seen in the graph, the LED is a narrow banded blue light emitting diode with a peak wavelength of approximately 465 nm.

Other wavelengths, e.g. white light, may be obtained by adding a fluorescent material to a transparent insulating material filled among the nanowires, or by modifying the band-gap using alloys selected from the III-V group, such as AlInGaN. However, both the described methods for modifying the light emitting diode to obtain white light involve complicated and expensive manufacturing steps.

It is therefore an object of the present invention to provide an improved light emitting diode arranged to emit light having a broadband spectral distribution, which substantially overcomes the disadvantages of the prior art while providing further improvements in terms of cost and manufacturing convenience.

SUMMARY OF THE INVENTION

This object is achieved by means of a light emitting diode as defined in claim 1, and a method for manufacturing such a light emitting diode as defined in claim 11. The appended sub-claims define advantageous embodiments in accordance with the present invention.

According to a first aspect of the present invention, there is provided a light emitting diode, comprising at least one p-doped structure, a plurality of n-doped zinc-oxide (ZnO) nanowires arranged on the at least one p-doped structure, thereby forming a plurality of p-n junctions, at least one insulating structure arranged among the plurality of ZnO-nanowires, to electrically separate the plurality of p-n junctions, and a transparent conductive layer, arranged on the at least one insulating structure and in electrical contact with the plurality of ZnO-nanowires, to enable application of a voltage over the plurality of p-n junctions, thereby enabling emission of light.

An advantage with the above light-emitting diode is its improved broadband spectral distribution. As ZnO-nanowires are used as active components, it is possible to achieve a very high brightness. ZnO is a semiconductor with a direct band-gap from the group II-VI in the periodic table that has properties similar to GaN, but with a higher direct band-gap of 3.37 eV, and 60 meV exciton binding energy at room temperature, which is almost three times larger than the binding energy of GaN. In addition, the ZnO-nanowires can produce white light without using added phosphors.

Photoluminescence and electroluminescence tests have shown a strong light emission in the UV-region at 380 nm, together with a broadband emission in the visible region.

The insulating structure will act as an insulator between the nanowires and the substrate, forcing the current to go through the ZnO-nanowires. Furthermore, the insulating structure should provide for the ability to fill the narrow spaces between the ZnO-nanowires, while planarizing the surface.

In a preferred embodiment of the present invention, the at least one p-doped structure is a p-doped layer. A large number of ZnO-nanowires may in this case be deposited on the p-doped layer.

Preferably the light emitting diode according to the present invention is arranged to emit light with a wavelength of 200 nm to 700 nm, more preferably 350 nm to 700 nm. Hence, the insulating structure should preferably be a transparent insulating structure being transparent for light having a wavelength of 200 nm to 700 nm. Furthermore, the transparent insulating structure should for example provide properties such as heat tolerance, crack resistance, refractive index matching to the nanowires etc.

The insulating structure is preferably selected from, a group comprising spin-on-glass (SOG), polymethylmethacrylate (PMMA), $S_iO_2$, an epoxy resin. The transparent insulating structure can for example be constituted by a plurality of sandwiched transparent insulating layers deposited on top of each other with curing steps in between, allowing for the ability to adjust the thickness of the total deposited structure, together with other physical properties to suit the dimensions of the structure in the best possible way. Spin-on-glass provides the optimal properties such as gap-filling ability, planarization, high thermal stability, crack and mechanical resistance, low dielectric constant, transparency in the UV and visible region, low stress and the ability to deposit multiple layers of spin-on glass with different properties, using deposition by ordinary spin-coating.

The light emitting diode may further comprise a conductor arranged in electrical contact with the at least one p-doped structure, for example arranged as a conductive current spreading layer. In one implementation, the conductive current spreading layer is sandwiched between the p-doped layer and a substrate, in the case where a substrate being insulating, such as sapphire or plastic.

In a preferred embodiment of the present invention, the light emitting diode comprises a plurality of p-doped structures constituted by a plurality of p-doped ZnO-nanowires arranged in contact with the plurality of n-doped ZnO-nanowires, thereby forming a plurality of p-n junctions. Such a nanowire homo p-n junction possesses in some cases advantages over the hetero junctions and over the nanowire/substrate homo p-n junctions in that it has a perfect lattice matching at the p-n junction interface. Furthermore, the reduced dimensionality at both sides of the p-n junction may enhance the recombination rate considerably.

As mentioned above, the tips of the ZnO-nanowires are electrically connected to a transparent conductive layer. The goal is to maximize transmittance while minimizing the resistance of the contact, two factors that lead to losses in efficiency. It is preferred to use one of Indium-Tin Oxide (ITO) or a thin metal layer, because of their advantageous electrical and optical properties, even when the applied layer is in the interval of 100 nm to 1000 nm. Other materials, such as an alloy, might also be used. The metallic layer may for example be deposited with e-beam evaporation or PVD.

According to another aspect of the present invention there is provided a method for manufacturing a light emitting diode, comprising the steps of arranging at least one p-doped structure on a substrate, forming a plurality of n-doped zinc-oxide (ZnO) nanowires on the at least one p-doped structure, thereby forming a plurality of p-n junctions, arranging at least one insulating structure among the plurality of ZnO-nanowires, to electrically separate the plurality of p-n junctions, and arranging a transparent conductive layer on the at least one insulating structure and in electrical contact with the plurality of ZnO-nanowires, to enable application of a voltage over the plurality of p-n junctions, thereby enabling emission of light. This method offers similar advantages as the previously discussed aspects of the invention as described above.

It is possible to form the plurality of n-doped ZnO-nanowires using different types of growth methods, for example high temperature MOCVD growth, but preferably a low temperature growth method is used, such a sol-gel method. The advantage with a low temperature growth is that at such a temperature there is no inter diffusion occurring at the p-n junctions, and this temperature may even be lower than the operating temperature of the device. As a result, the junction will have a very high stability and long lifetime.

According to still another aspect of the present invention there is provided an illumination system, comprising control means, power supply and a light emitting diode as described above. For example, one can package a single chip LED or multi chip LED, and the device can be driven either by a DC power supply or an AC power supply.

Further features of, and advantages with, the present invention will become apparent when studying the appended claims and the following description. Those skilled in the art realize that different features of the present invention can be combined to create embodiments other than those described in the following.

BRIEF DESCRIPTION OF THE DRAWINGS

These and other aspects of the present invention will now be described in more detail, with reference to the appended drawings showing currently preferred embodiment of the invention, in which like numerals indicates like parts.

DETAILED DESCRIPTION OF CURRENTLY PREFERRED EMBODIMENTS

Figure 1:
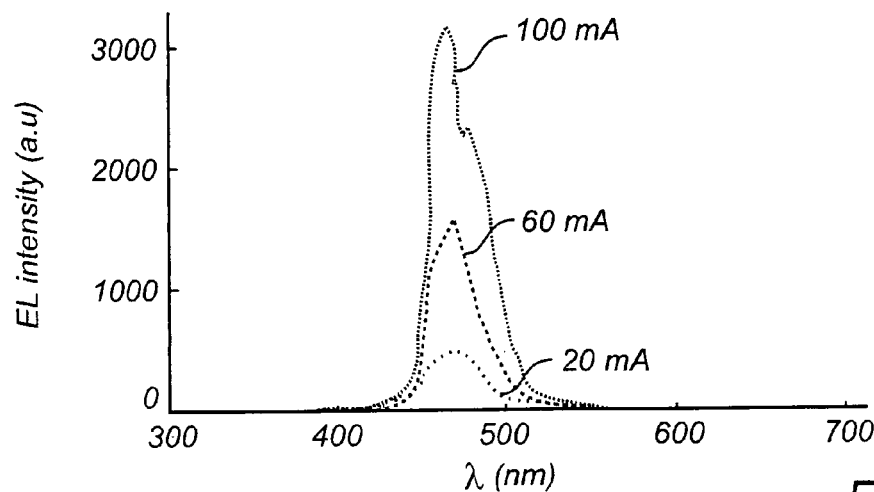
FIG. 1 is a graph showing EL (electroluminescence) intensity of an LED as described in prior art.
Figure 2:
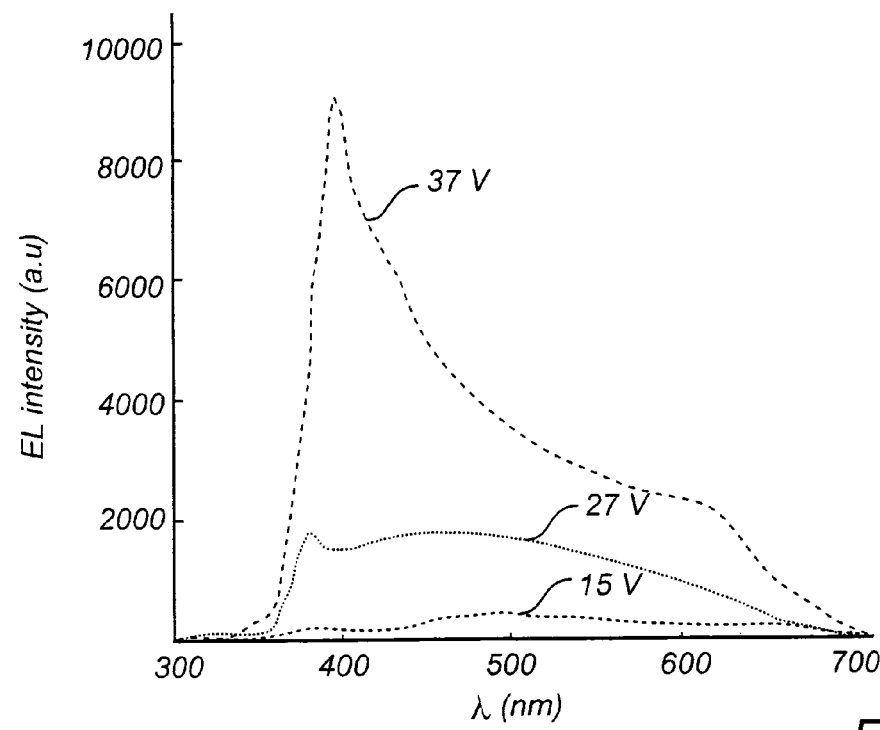
FIG. 2 is a graph showing EL intensity of an LED according to a currently preferred embodiment of the present invention.

FIG. 2 is a graph showing the EL (electroluminescence) spectrum of the LED according to an embodiment of the present invention, when a voltage of 15 V, 27 V and 37 V is applied thereto. As can be seen in the graph, the LED according to this embodiment provides a broadband spectral distribution, having a characteristic band edge emission at about 380 nm. The LED according to the present invention provides for a higher brightness in comparison to the prior art GaN LED shown in FIG. 1.

Figure 3A:
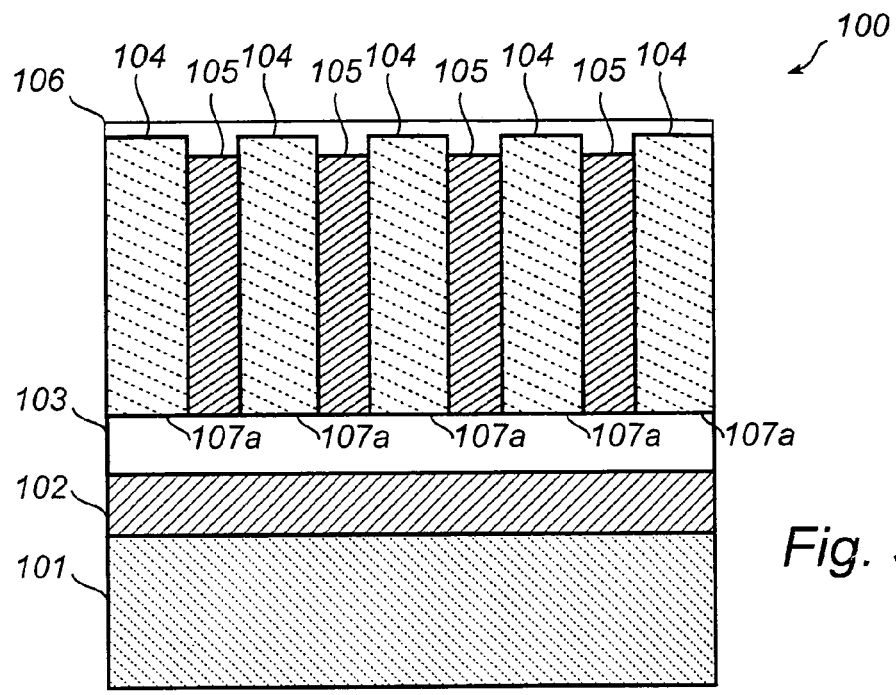
FIGS. 3a and 3b are schematic side views showing a section of different preferred embodiment of the present invention.

In FIG. 3a, a currently preferred embodiment of the present invention is shown. A schematic side view illustrates a section of a light-emitting diode (LED) 100 comprising a metallic contact 102 sandwiched between a substrate 101, such as a substrate made of sapphire, and a p-doped layer 103. A plurality of ZnO-nanowires 104 are arranged onto the p-doped layer 103, forming a plurality of p-n junctions 107a. A transparent insulating structure 105 is arranged-among the plurality of ZnO-nanowires 104, to electrically separate the plurality of ZnO-nanowires 104. Additionally, a transparent conductive layer 106, for example but not limited to, a metallic layer or an ITO-layer is arranged on the insulating structure 105 and in electrical contact with the plurality of ZnO-nanowires 104. Preferably, the transparent insulating structure 105 is arranged among the plurality of ZnO-nanowires 104 in a height lower than the plurality of ZnO-nanowires 104, such that top ends of the plurality of ZnO-nanowires 104 are exposed to a predetermined extent.

Figure 4:
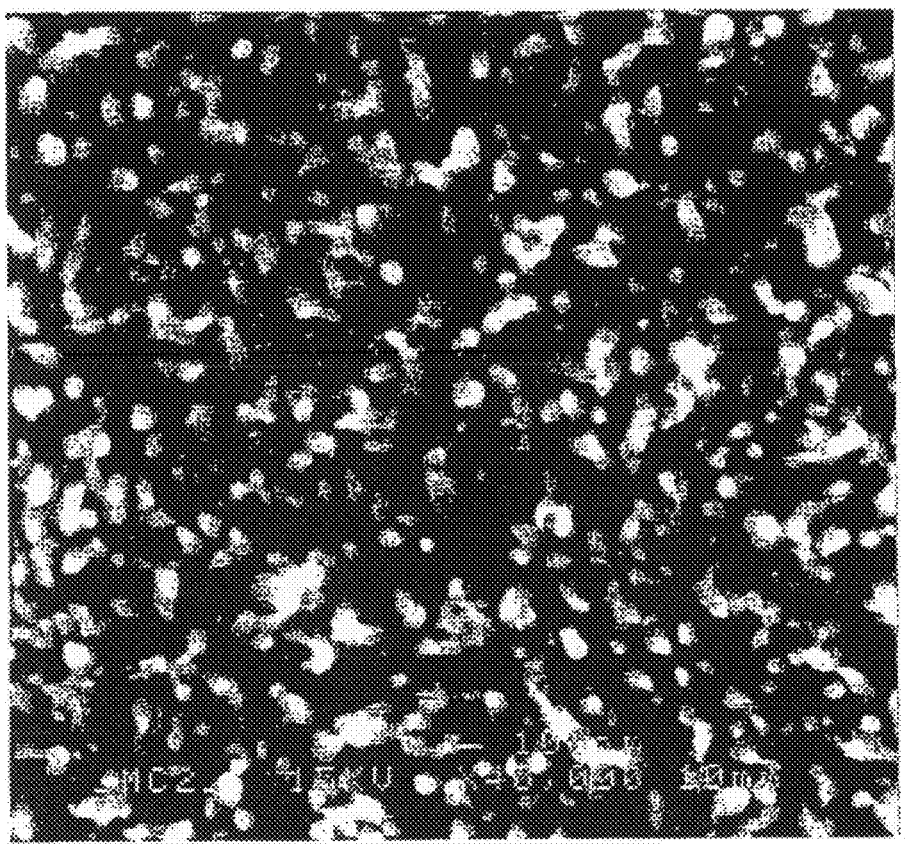
FIG. 4 illustrates a field emission scanning electron microscope image of ZnO nanowires.

In a first exemplary method for manufacturing an LED 100 according to a preferred embodiment of the invention, the plurality of ZnO-nanowires 104 are grown by a low temp growth sol-gel method. The resulting height of the ZnO-nanowires 104 are approximately 1 um, having an average diameters varying between 100 and 200 nm. In FIG. 4 a scanning electron microscope (SEM) image of ZnO-nanowires grown by a low temp growth sol-gel method can be seen. The transparent insulating structure 105, such as Honeywell 512B spin-on glass (SOG), is arranged among the ZnO-nanowires 104 using a regular spin-coater at 2000 rpm for 60 s. This gives an approximate thickness of 0.6 um. The SOG is then baked on a hot plate at 80° C. for one minute to evaporate solvents remaining in the SOG.

To achieve a height lower than the plurality of ZnO-nanowires 104, the SOG may be etched in a plasma etcher in a mixture of Ar(10 ccm) and CF4(42.5 ccm) at 200 W for one minute. This etches away approximately 0.3 um of the SOG-layer, and exposes the ZnO-nanowires 104 for electrical contacting. The SOG is then successively cured at 80, 150 and 250° C. for one minute on a hot plate. This is followed by a longer cure in an oven for 1 hour at 300° C. After that, the transparent conductive layer 106 is arranged onto the SOG structure. For example, a layer of Ti/Au or an ITO-layer might be deposited using electron beam evaporation.

When a potential difference occurs between the metallic contact 102 and the transparent conductive layer 106, the energy levels are caused to shift. Under these conditions there is a significant increase in the concentration of electrons in the conduction band near the p-n junctions 107a on the n-side, and the concentration of holes in the valence band near the p-n junctions 107a on the p-side. The electrons and holes recombine, and energy is given off in the form of photons, i.e. light is emitted. The energy of the photon resulting from this recombination is equal to that associated with the energy gap. Hence, a ZnO LED will give a higher brightness than a GaN LEDs (as can be seen when comparing FIG. 1 and FIG. 2).

The light will emit laterally and longitudinally from the p-n junctions 107a between the p-doped layer 103 and the ZnO-nanowires 104, thus the need for the insulating structure 105 to have transparent characteristics. The light emitted by a LED according to the present invention has, as mentioned above, a broadband spectral distribution, with a characteristic band edge emission at about 380 nm.

As understood by the person skilled in the art, it would be possible to combine the substrate 101 and the p-doped layer 103, for example by using a p-doped 4H Silicon Carbide (4H—SiC) layer. In this case, the conductive layer 102 may be arranged on the opposite side of the ZnO-nanowires 104, or onto a protruding part of the 4H—SiC layer.

Furthermore, to achieve a good planarization when using SOG as the insulating structure 105, multiple layers of SOG can be deposited on top of each other with curing steps in between, allowing for the possibility to adjust the thickness of the total insulating structure 105, together with other physical properties to suit the dimensions of the LED in the best possible way.

Figure 3B:
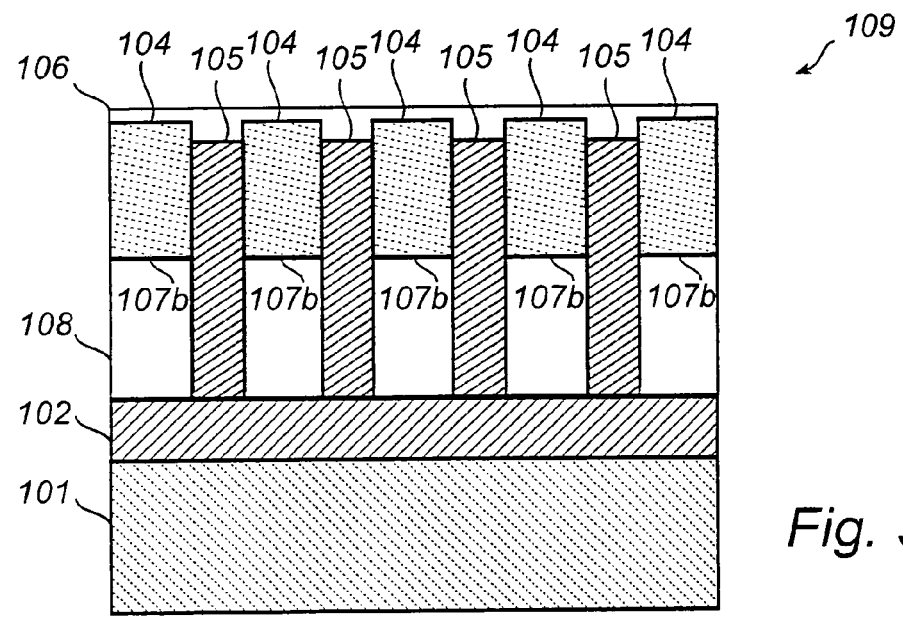

In FIG. 3b, another preferred embodiment of the present invention is shown. In this embodiment, the LED 109 comprises a plurality of p-doped structures constituted by a plurality of p-doped ZnO-nanowires 108 arranged in contact with the plurality of n-doped ZnO-nanowires 104, thereby forming a plurality of p-n junctions 107b. Such a nanowire homo p-n junction 107b possesses certain advantages over the hetero junctions and over the ZnO-nanowire/substrate homo p-n junctions 107a in that it has a perfect lattice matching at the p-n junction interface. Furthermore, the reduced dimensionality at both sides of the p-n junction 107b may enhance the recombination rate considerably. As understood by the person skilled in the are, there is in this case no need for a p-doped layer.

Turning now to FIG. 4, wherein a field emission scanning electron microscope image of the growth morphology of ZnO-nanowires on a SiC substrate is shown. As can be seen, the ZnO-nanowires has a typical "grass-like" growth. The diameters of the ZnO-nanowires are around 100 nm. An advantage with an LED according to the present invention is that the ZnO-nanowires do not have to be essentially perpendicularly to the p-doped layer. On the contrary, if the ZnO-nanowires are well aligned, light will only emit in one direction and not spread in all directions as is desired for general lighting applications.

Although the present invention and its advantages have been described in detail, is should be understood that various changes, substitutions and alternations can be made herein without departing from the spirit and scope of the invention as defined by the appended claims. For example, the invention is not limited to the above mentioned types of substrates, but can for example be replaced by a p-PEDOT, p-SrCu2O2, p-Si, p-AlCuO, or other p-type substrates.

The invention claimed is:

1. A light emitting diode (LED), for broadband emission of light having a wavelength between 200 nm and 700 nm, comprising:
   at least one p-doped structure;
   a plurality of low-temperature growth n-doped zinc-oxide (ZnO) nanowires that are uniformly doped on the at least one p-doped structure, thereby forming a plurality of p-n junctions;
   at least one insulating structure arranged among the plurality of low-temperature growth n-doped ZnO-nanowires that are uniformly doped, to electrically separate the plurality of p-n junctions; and
   a transparent conductive layer, arranged on the at least one insulating structure and in electrical contact with the plurality of low-temperature growth n-doped ZnO-nanowires that are uniformly doped, to enable application of a voltage over the plurality of p-n junctions, thereby enabling emission of light.

2. The light emitting diode according to claim 1, wherein the at least one p-doped structure is a p-doped layer.

3. The light emitting diode according to claim 2, wherein at least one of the plurality of low-temperature growth n-doped zinc-oxide ZnO-nanowires that are uniformly doped is not perpendicular to the p-doped layer.

4. The light emitting diode according to claim 1, wherein the at least one insulating structure is a transparent insulating structure being-transparent for light having a wavelength of 200 nm to 700 nm.

5. The light emitting diode according to claim 1, wherein the at least one insulating structure is selected from a group comprising spin on-glass (SOG), polymethylmethacrylate (PMMA), SiO2, and epoxy resin.

6. The light emitting diode according to claim 1, further comprising:
   a conductor arranged in electrical contact with the at least one p-doped structure.

7. The light emitting diode according to claim 6, wherein the conductor is a conductive layer.

8. The light emitting diode claim 1, wherein the at least one insulating structure is constituted by a plurality of sandwiched transparent insulating layers.

9. The light emitting diode according to claim 1, wherein the at least one p-doped structure comprises a plurality of p-doped structures constituted by a plurality of p-doped ZnO-nanowires arranged in contact with the plurality of low temperature growth n-doped ZnO-nanowires that are uniformly doped, thereby forming the plurality of p-n junctions.

10. The light emitting diode according to claim 1, wherein the transparent conductive layer is selected from a group comprising Indium Tin Oxide (ITO), a thin metal layer, and an alloy.

11. An illumination system, comprising a controller, a power supply and the light emitting diode according to claim 1.

12. The light emitting diode according to claim 1, wherein the plurality of low-temperature growth n-doped ZnO-nanowires that are uniformly doped limit inter-diffusion between the at least one p-doped structure and the plurality of low-temperature growth n-doped zinc-oxide ZnO-nanowires that are uniformly doped at the plurality of p-n junctions.

13. The light emitting diode according to claim 1, wherein a height of the plurality of low-temperature growth n-doped ZnO-nanowires is approximately 1 μm.

14. The light emitting diode according to claim 13, wherein an average diameter of the plurality of low-temperature growth n-doped ZnO-nanowires is in a range of 100-200 nm.

15. The light emitting diode according to claim 1, wherein an average diameter of the plurality of low-temperature growth n-doped ZnO-nanowires is in a range of 100-200 nm.

16. A method for manufacturing a light emitting diode configured for broadband emission of light having a wavelength between 200 nm and 700 nm comprising:
   arranging at least one p-doped structure on a substrate;
   forming a plurality of low temperature growth n-doped zinc-oxide (ZnO) nanowires that are uniformly doped on the at least one p-doped structure, thereby forming a plurality of p-n junctions;

arranging at least one insulating structure among the plurality of low temperature growth n-doped ZnO-nanowires that are uniformly doped, to electrically separate the plurality of p-n junctions; and arranging a transparent conductive layer on the at least one insulating structure and in electrical contact with the plurality of low temperature growth n-doped ZnO-nanowires that are uniformly doped, to enable application of a voltage over the plurality of p-n junctions, thereby enabling emission of light.

17. The method according to claim 16, wherein the step of arranging the at least one insulating structure comprises:

arranging at least two insulating layers on top of each other before the step of arranging the transparent conductive layer.

18. The method according to claim 16, wherein the at least one insulating structure is a transparent insulating structure selected from a group comprising spin-on-glass (SOG), polymethylmethacrylate (PMMA), SiO2, and epoxy resin.

19. The method according to claim 16, further comprising: arranging a conductor in electrical contact with the at least one p-doped structure.

20. The method according to claim 16, wherein the plurality of low-temperature growth n-doped zinc-oxide zinc-oxide ZnO-nanowires that are uniformly doped limit inter-diffusion between the at least one p-doped structure and the plurality of low-temperature growth zinc-oxide ZnO-nanowires that are uniformly doped at the plurality of p-n junctions.

21. The light emitting diode according to claim 16, wherein the at least one p-doped structure is a p-doped layer.

22. The light emitting diode according to claim 21, wherein at least one of the plurality of low-temperature growth n-doped ZnO-nanowires that are uniformly doped is not perpendicular to the p-doped layer.

23. The method according to claim 16, wherein a height of the plurality of low-temperature growth n-doped ZnO-nanowires is approximately 1 μm.

24. The method according to claim 23, wherein an average diameter of the plurality of low-temperature growth n-doped ZnO-nanowires is in a range of 100-200 nm.

25. The method according to claim 16, wherein an average diameter of the plurality of low-temperature growth n-doped ZnO-nanowires is in a range of 100-200 nm.

* * * * *